United States Patent
Liang

(10) Patent No.: US 8,536,847 B2
(45) Date of Patent: Sep. 17, 2013

(54) SEMICONDUCTOR DEVICE

(75) Inventor: Xiaoguang Liang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/456,510

(22) Filed: Apr. 26, 2012

(65) Prior Publication Data
US 2013/0063123 A1     Mar. 14, 2013

(30) Foreign Application Priority Data
Sep. 14, 2011 (JP) ................................. 2011-200487

(51) Int. Cl.
*G05F 1/40* (2006.01)

(52) U.S. Cl.
USPC ........................................................ 323/282

(58) Field of Classification Search
USPC .................. 323/282–285, 288, 351
See application file for complete search history.

(56) References Cited

U.S. PATENT DOCUMENTS

| | | | |
|---|---|---|---|
| 6,529,034 B1 | 3/2003 | Ranjan | |
| 7,068,082 B2 * | 6/2006 | Kojima | 327/108 |
| 7,298,634 B2 * | 11/2007 | Yasumura | 363/24 |
| 7,746,004 B2 * | 6/2010 | Kimura et al. | 315/291 |
| 8,217,603 B2 * | 7/2012 | Akama et al. | 318/400.21 |
| 8,432,139 B2 * | 4/2013 | Suzuki | 323/222 |
| 2003/0102886 A1 | 6/2003 | Ranjan | |
| 2010/0072967 A1 * | 3/2010 | Kamishinbara et al. | 323/284 |
| 2010/0073976 A1 * | 3/2010 | Kimura et al. | 363/95 |
| 2013/0088266 A1 | 4/2013 | Liang | |

FOREIGN PATENT DOCUMENTS

| | | |
|---|---|---|
| JP | 11-205112 | 7/1999 |
| JP | 2003-198347 | 7/2003 |

\* cited by examiner

*Primary Examiner* — Adolf Berhane
(74) *Attorney, Agent, or Firm* — Oblon, Spivak, McClelland, Maier & Neustadt, L.L.P.

(57) ABSTRACT

A semiconductor device includes high-side and low-side switching elements totem-pole-connected between high-voltage-side and low-voltage-side potentials; a high-side drive circuit, having high-voltage and low-voltage terminals which are connected to a floating power supply, which supplies either a voltage at the high-voltage terminal or a voltage at the low-voltage terminal for driving the high-side switching element; and a low-side drive circuit driving the low-side switching element and a reference voltage circuit generating a reference voltage between the voltages at high-voltage and low-voltage terminals of the high-side drive circuit. The reference voltage circuit supplies the reference voltage to a connection point between the high-side and low-side switching elements. The semiconductor device includes a charging switching element having a control terminal, a first terminal connected to the low-voltage terminal of the high-side drive circuit, and a grounded second terminal.

4 Claims, 4 Drawing Sheets

SEMICONDUCTOR DEVICE

BACKGROUND OF THE INVENTION

1. Field of the Invention

The present invention relates to a semiconductor device capable of supplying a drive voltage to a high-side drive circuit by means of a bootstrap capacitor while a high-side drive circuit is performing negative-bias drive.

2. Background Art

In a half-bridge circuit, a drive voltage higher than the voltage of a main power supply is required for a high-side drive circuit for driving a high-side switching element. Also, with drive of a low-side switching element, a reference potential (a potential at a low-voltage terminal) for the high-side drive circuit fluctuates between a high-voltage-side potential and a low-voltage-side potential in the half-bridge circuit. There is, therefore, a need to use a floating power supply floating from the low-voltage-side potential as a drive voltage source for the high-side drive circuit. Obtaining a voltage for driving the high-side drive circuit by charging a bootstrap capacitor connected between a high-voltage terminal and a low-voltage terminal of the high-side drive circuit from a low-side drive power supply is known (see, for example, Japanese Patent Laid-Open No. 11-205112).

In a semiconductor device using a bootstrap circuit, a low-voltage terminal of a high-side drive circuit is connected to a connection point between a high-side switching element and a low-side switching element. Therefore, when the potential at the low-voltage terminal of the high-side drive circuit is made equal to GND potential by turn-on of the low-side switching element, a bootstrap capacitor is charged.

A semiconductor device is also known in which a high-side drive circuit performs negative bias drive. This semiconductor device has a reference voltage circuit that generates a reference voltage between the voltage at a high-voltage terminal of the high-side drive circuit and the voltage at a low-voltage terminal of the high-side drive circuit and supplies the reference voltage to the source of a high-side switching element. The high-side drive circuit is thereby enabled to supply a negative voltage to the gate of the high-side switching element with respect to the source at the time of turn-off.

SUMMARY OF THE INVENTION

In the semiconductor device in which high-side drive circuit performs negative bias drive, the low-voltage terminal of the high-side drive circuit is not connected to the connection point between the high-side switching element and the low-side switching element and no route for charging a bootstrap capacitor via the low-side switching element exists. Therefore, even when the low-side switching element is turned on, the potential at the low-voltage terminal of the high-side drive circuit is not made equal to GND potential and the bootstrap capacitor is not charged, so that a drive voltage cannot be supplied from the bootstrap capacitor to the high-side drive circuit.

In view of the above-described problems, an object of the present invention is to provide a semiconductor device capable of supplying a drive voltage to a high-side drive circuit by means of a bootstrap capacitor while a high-side drive circuit is performing negative-bias drive.

According to the present invention, a semiconductor device includes: a high-side switching element and a low-side switching element totem-pole-connected in this order from a high-voltage side between a high-voltage-side potential and a low-voltage-side potential; a high-side drive circuit including a high-voltage terminal and a low-voltage terminal which are connected to a floating power supply, the high-side drive circuit supplying one of a voltage at the high-voltage terminal and a voltage at the low-voltage terminal to the high-side switching element to drive the high-side switching element; a low-side drive circuit driving the low-side switching element; a reference voltage circuit generating a reference voltage between the voltage at the high-voltage terminal and the voltage at the low-voltage terminal of the high-side drive circuit and supplying the reference voltage to a connection point between the high-side switching element and the low-side switching element; and a charging switching element having a control terminal, a first terminal connected to the low-voltage terminal of the high-side drive circuit, and a second terminal grounded.

The present invention makes it possible to supply a drive voltage to a high-side drive circuit by means of a bootstrap capacitor while a high-side drive circuit is performing negative-bias drive.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
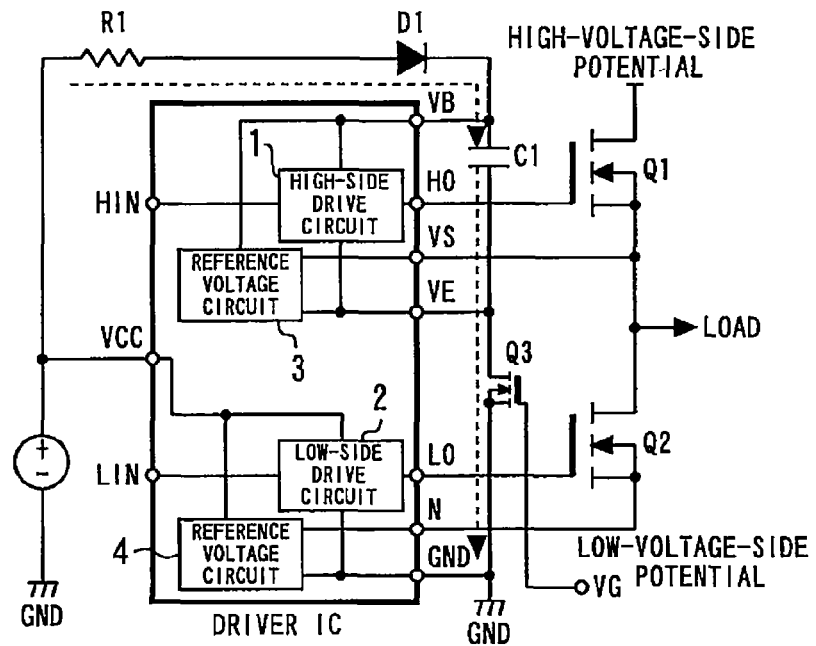
FIG. 1 is a diagram showing a semiconductor device according to a first embodiment of the present invention.

FIG. 1 is a diagram showing a semiconductor device according to a first embodiment of the present invention. This device is a half-bridge circuit having a high-side switching element Q1 and a low-side switching element Q2 totem-pole-connected in this order from a high-voltage side between a high-voltage-side potential and a low-voltage-side potential.

A high-side drive circuit 1 supplies one of a voltage at a high-voltage terminal VB and a voltage at a low-voltage terminal VE through an output terminal HO to the gate of the high-side switching element Q1 according to a control signal input through a HIN terminal to drive the high-side switching element Q1.

A low-side drive circuit 2 supplies one of a voltage at a high-voltage terminal VCC and a voltage at a low-voltage terminal GND to the gate of the low-side switching element Q2 through an output terminal LO according to a control signal input through a LIN terminal to drive the low-side switching element Q2.

A reference voltage circuit 3 generates a reference voltage between the voltage at the high-voltage terminal VB and the voltage at the low-voltage terminal VE of the high-side drive circuit 1 and supplies the reference voltage to a connection point between the high-side switching element Q1 and the low-side switching element Q2 through an output terminal VS.

A reference voltage circuit 4 generates a reference voltage between the voltage at the high-voltage terminal VCC of the low-side drive circuit 2 and the voltage at the low-voltage terminal GND of the low-side drive circuit 2 and supplies the reference voltage to the source of the low-side switching element Q2 through an output terminal N.

With drive of the low-side switching element Q2, a reference potential (a potential at the low-voltage terminal VE) in the high-side drive circuit 1 fluctuates between a high-voltage-side potential and a low-voltage-side potential of the half-bridge circuit. There is, therefore, a need to use a floating power supply floating from the low-voltage-side potential as a drive voltage source for the high-side drive circuit 1. Then a bootstrap capacitor C1 is used. One end of the bootstrap capacitor C1 is connected to the high-voltage terminal VB of the high-side drive circuit 1. The other end of the bootstrap capacitor C1 is connected to the low-voltage terminal VE of the high-side drive circuit 1.

The anode of a bootstrap diode D1 is connected to a low-side drive power supply through a resistor R1. The cathode of the bootstrap diode D1 is connected to the one end of the bootstrap capacitor C1. The bootstrap diode D1 supplies a current from the low-side drive power supply to the one end of the bootstrap capacitor C1.

The drain of a charging switching element Q3 is connected to the other end of the bootstrap capacitor C1, and the source is grounded. A gate voltage externally supplied is input to the gate VG of the charging switching element Q3.

Figure 2:
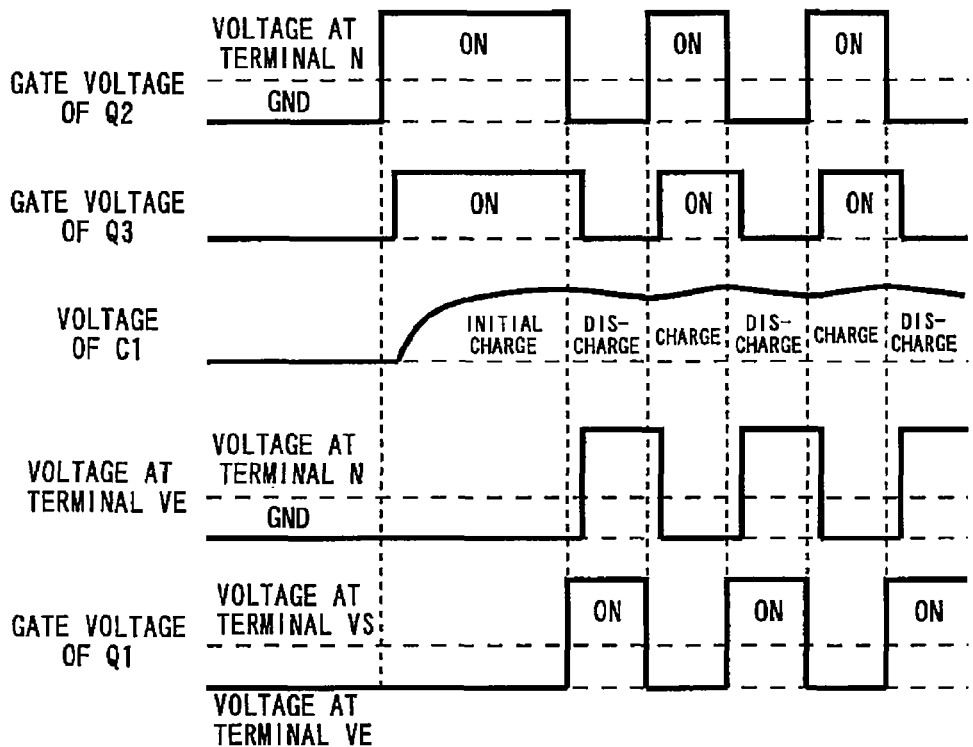
FIG. 2 is a timing chart showing the operation of the semiconductor device according to the first embodiment of the present invention.

FIG. 2 is a timing chart showing the operation of the semiconductor device according to the first embodiment of the present invention. The charging switching element Q3 is turned on shortly after a time when the high-side switching element Q1 is turned off and when the low-side switching element Q2 is turned on. The potential at the VE terminal is thereby made equal to GND potential to forwardly bias the bootstrap diode D1. As a result, the bootstrap capacitor C1 is charged.

On the other hand, after a time when the high-side switching element Q1 is turned on and when the low-side switching element Q2 is turned off, the charging switching element Q3 is turned off. The potential at the VE terminal is set to high level to reversely bias the bootstrap diode D1. As a result, the bootstrap capacitor C1 is discharged.

Figure 3:
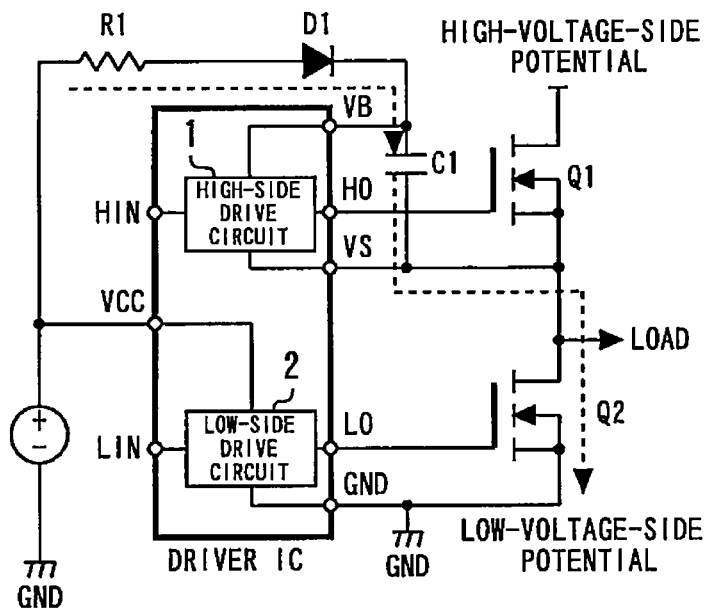
FIG. 3 is a diagram showing a semiconductor device according to comparative example 1.

The effects of the present embodiment will be described in comparison with comparative examples 1 and 2. FIG. 3 is a diagram showing a semiconductor device according to comparative example 1. This device is an ordinary semiconductor device using a bootstrap circuit, in which negative bias drive is not performed. The low-voltage terminal VS of the high-side drive circuit 1 is connected to the connection point between the high-side switching element Q1 and the low-side switching element Q2. Therefore, when the potential at the low-voltage terminal VS of the high-side drive circuit 1 is made equal to GND potential by turn-on of the low-side switching element Q2, the bootstrap capacitor C1 is charged.

Figure 4:
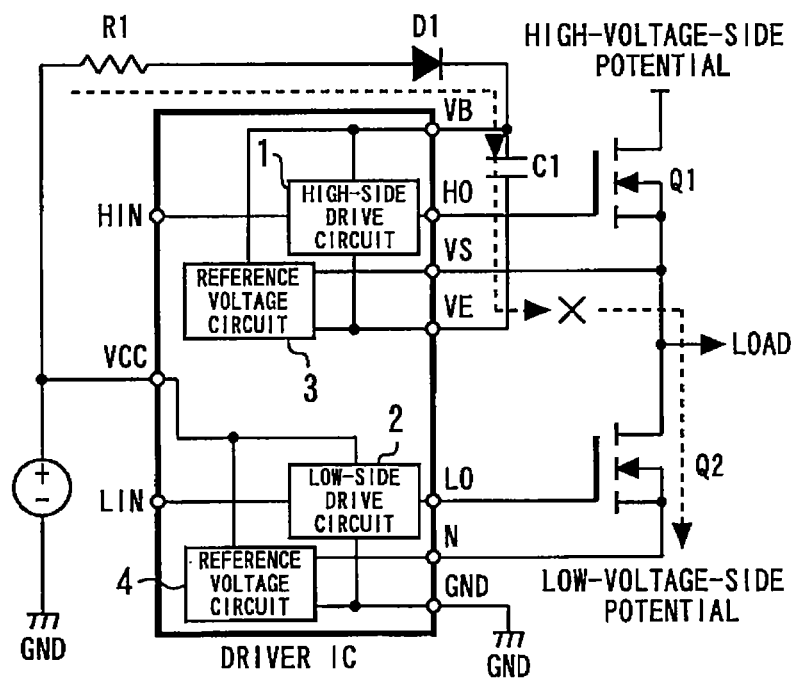
FIG. 4 is a diagram showing a semiconductor device according to comparative example 2.

FIG. 4 is a diagram showing a semiconductor device according to comparative example 2. In this device, a bootstrap circuit is used and negative bias drive is performed. However, the charging switching element Q3 in the present embodiment does not exist. The low-voltage terminal VE of the high-side drive circuit 1 is not connected to the connection point between the high-side switching element Q1 and the low-side switching element Q2, and the route to charge the bootstrap capacitor C1 via the low-side switching element Q2 does not exist. Therefore, even when the low-side switching element Q2 is turned on, the potential at the low-voltage terminal VE of the high-side drive circuit 1 is not made equal to GND potential and the bootstrap capacitor C1 is not charged. Therefore, a drive voltage cannot be supplied from the bootstrap capacitor C1 to the high-side drive circuit 1.

In the present embodiment, the charging switching element Q3 is provided between the other end of the bootstrap capacitor C1 and a grounding point. When the potential at the terminal VE is made equal to GND by turn-on of the charging switching element Q3, the bootstrap capacitor C1 is charged through the diode D1 and the charging switching element Q3. Thus, a drive voltage can be supplied to the high-side drive circuit 1 by means of the bootstrap capacitor C1 while the high-side drive circuit 1 is performing negative bias drive.

It is preferable to control the externally-supplied gate voltage on the charging switching element Q3 so that turn-on of the charging switching element Q3 is delayed relative to turn-on of the low-side switching element Q2. This control enables switching of the charging switching element Q3 in a low-voltage state. As a result, an improvement in reliability is achieved.

Second Embodiment

Figure 5:
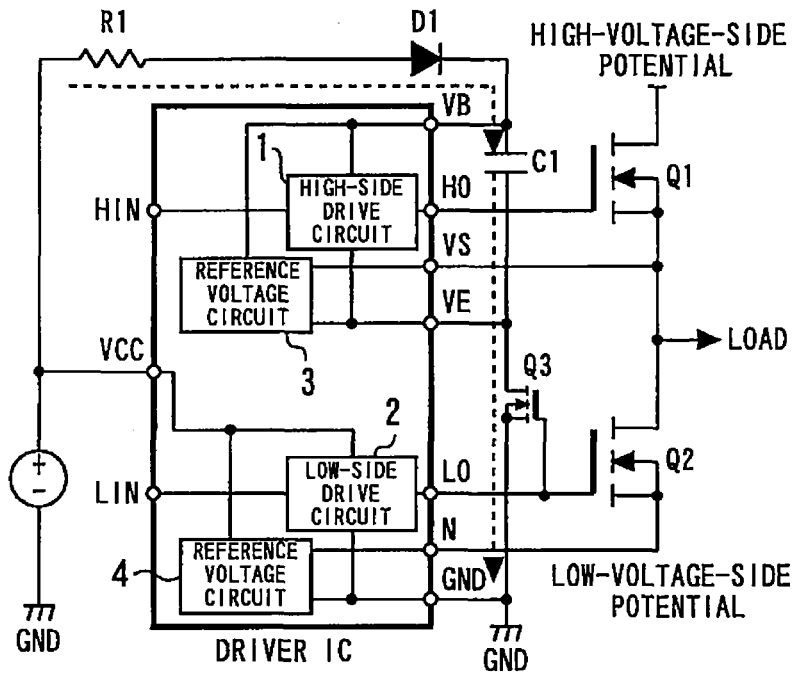
FIG. 5 is a diagram showing a semiconductor device according to a second embodiment of the present invention.

FIG. 5 is a diagram showing a semiconductor device according to a second embodiment of the present invention. The control terminal of the charging switching element Q3 is connected to the output terminal of the low-side drive circuit 2. In other respects, the configuration is the same as that in the first embodiment. The need to separately supply the gate voltage to the charging switching element Q3 from the outside is eliminated in this way, thus enabling simplification of the circuit configuration.

Third Embodiment

Figure 6:
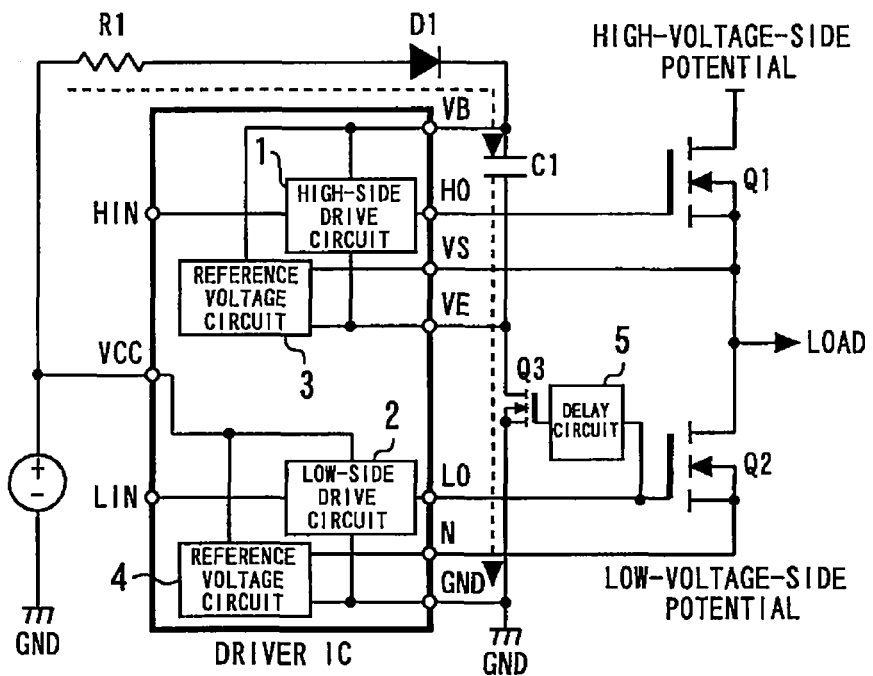
FIG. 6 is a diagram showing a semiconductor device according to a third embodiment of the present invention.

FIG. 6 is a diagram showing a semiconductor device according to a third embodiment of the present invention. A delay circuit 5 is connected between the control terminal of the charging switching element Q3 and the output terminal of the low-side drive circuit 2. In other respects, the configuration is the same as that in the second embodiment. The delay circuit 5 delays turn-on of the charging switching element Q3 relative to turn-on of the low-side switching element Q2, thereby enabling switching of the charging switching element Q3 in a low-voltage state. As a result, an improvement in reliability is achieved.

Fourth Embodiment

Figure 7:
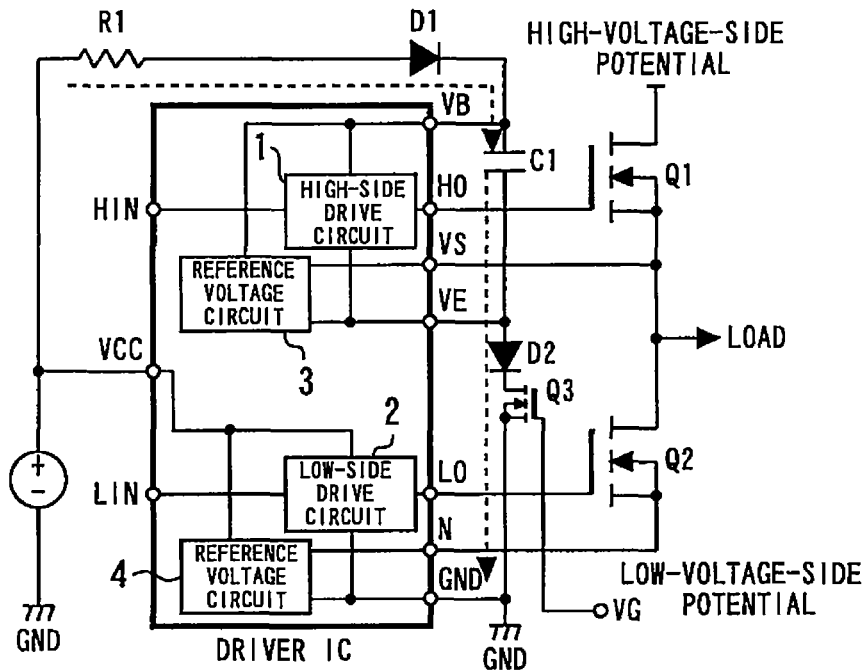
FIG. 7 is a diagram showing a semiconductor device according to a fourth embodiment of the present invention.

FIG. 7 is a diagram showing a semiconductor device according to a fourth embodiment of the present invention. A reverse current prevention diode D2 is connected between the bootstrap capacitor C1 and the charging switching element Q3. In other respects, the configuration is the same as that in the first embodiment.

The reverse current prevention diode D2 prevents a reverse current through the charging switching element Q3 caused, for example, by a back current from the high-side switching element Q1 and the low-side switching element Q2, thereby achieving an improvement in reliability. The reverse current prevention diode D2 may be provided in the configurations in the second and third embodiments.

Fifth Embodiment

Figure 8:
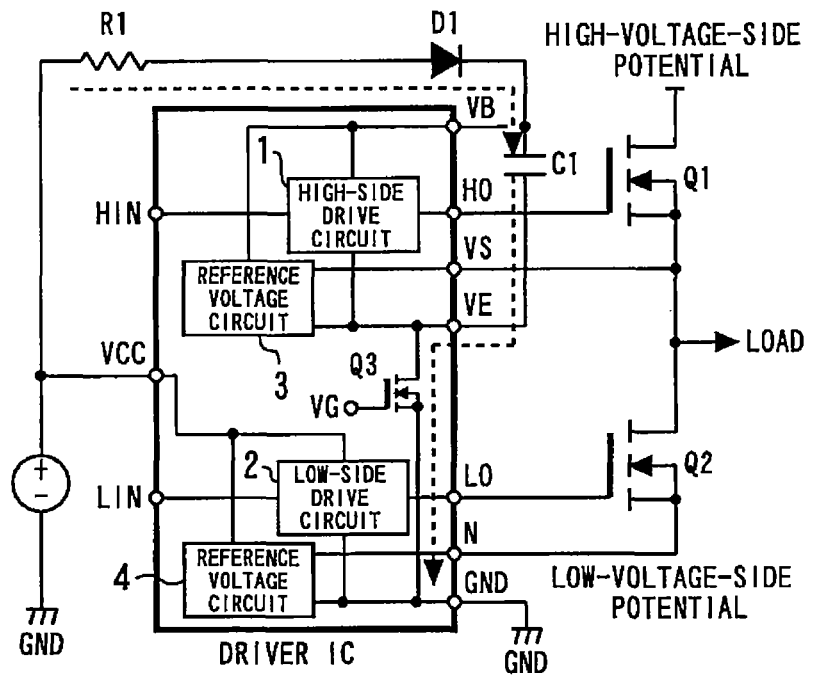
FIG. 8 is a diagram showing a semiconductor device according to a fifth embodiment of the present invention.

FIG. 8 is a diagram showing a semiconductor device according to a fifth embodiment of the present invention. The charging switching element Q3 is incorporated in the driver IC. In other respects, the configuration is the same as that in the first embodiment. The circuit configuration can be simplified in this way.

In the above-described first to fifth embodiments, the high-side switching element Q1 and the low-side switching element Q2 are n-channel MOSFETs. However, elements of this kind are not exclusively used. Other power switching elements such as MOSFETs, IGBTs or SiC-MOSFETs may alternatively be used.

Also, the high-side switching elements Q1 and the low-side switching element Q2 are not limited to those formed of silicon. These switching elements may alternatively be formed of a wide-bandgap semiconductor having a bandgap larger than that of silicon. The wide-bandgap semiconductor is, for example, silicon carbide, a gallium nitride-based material or diamond. A power semiconductor element formed of such a wide-bandgap semiconductor has a high voltage withstand characteristic and a high allowable current density and, therefore, can be reduced in size. If such an element reduced in size is used, the semiconductor module incorporating the element can also be reduced in size. Also, since the element has high heat resistance, the size of heat radiating fins of a heat sink for the semiconductor module can be reduced and a water-cooled portion can be air-cooled. Therefore the size of the semiconductor module can be further reduced. Since the element has a reduced power loss and high efficiency, the semiconductor module can have higher efficiency. While it is desirable that each of the switching element and the diode element be formed of a wide-bandgap semiconductor, only one of the switching element and the diode element may be formed of a wide-bandgap semiconductor. Also in such a case, the effects described with respect to the embodiments can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-200487, filed on Sep. 14, 2011 including specification, claims, drawings and summary, on which the Convention priority of the present application is based, are incorporated herein by reference in its entirety.

What is claimed is:

1. A semiconductor device comprising:
a high-side switching element and a low-side switching element totem-pole-connected in this order from a high-voltage side between a high-voltage-side potential and a low-voltage-side potential;
a high-side drive circuit including a high-voltage terminal and a low-voltage terminal which are connected to a floating power supply, the high-side drive circuit supplying one of a voltage at the high-voltage terminal and a voltage at the low-voltage terminal to the high-side switching element to drive the high-side switching element;
a low-side drive circuit driving the low-side switching element;
a reference voltage circuit generating a reference voltage between the voltage at the high-voltage terminal and the voltage at the low-voltage terminal of the high-side drive circuit and supplying the reference voltage to a connection point between the high-side switching element and the low-side switching element; and
a charging switching element having a control terminal, a first terminal connected to the low-voltage terminal of the high-side drive circuit, and a second terminal grounded.

2. The semiconductor device according to claim 1, wherein the control terminal of the charging switching element is connected to an output terminal of the low-side drive circuit.

3. The semiconductor device according to claim 2, further comprising a delay circuit connected between the control terminal of the charging switching element and the output terminal of the low-side drive circuit.

4. The semiconductor device according to claim 1, further comprising a reverse current prevention diode connected between the low-voltage terminal of the high-side drive circuit and the charging switching element.

* * * * *